Figure 1A:
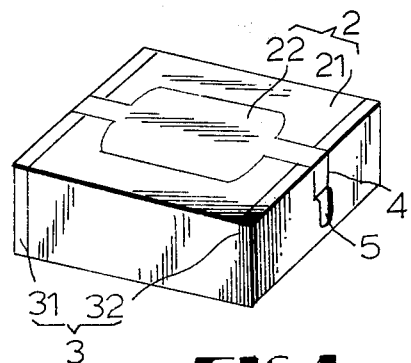

United States Patent [19]

Nakata et al.

[11] 4,417,298
[45] Nov. 22, 1983

[54] CHIP TYPE TANTALUM CAPACITOR

[76] Inventors: Koreaki Nakata, 12-27, Mefugaoka, Takarazuka-shi, Hyogo-ken; Tsunehiko Todoroki, 231-37, Matsukasa-cho, Yamatokoriyama-shi, Nara-ken; Masahiro Oita, 3-4-18, Kamiichi, Kashiwara; Nobumasa Oshima, 3-19-5, Hirakata, all of Japan

[21] Appl. No.: 150,656

[22] Filed: May 16, 1980

[51] Int. Cl.$^3$ .............................................. H01G 9/00
[52] U.S. Cl. ..................................... 361/433; 357/17; 357/72
[58] Field of Search ....................... 361/433, 306, 308; 357/17, 72, 74, 68; 338/272, 276; 337/232, 252, 253

[56] References Cited

U.S. PATENT DOCUMENTS

| | | | |
|---|---|---|---|
| 4,024,627 | 5/1977 | Stanffer | 357/17 |
| 4,205,365 | 5/1980 | Kalina | 357/72 |
| 4,247,883 | 1/1981 | Thompson et al. | 361/433 |
| 4,255,779 | 3/1981 | Meal | 361/433 |

*Primary Examiner*—William D. Larkins
*Attorney, Agent, or Firm*—Wenderoth, Lind & Ponack

[57] ABSTRACT

A chip type tantalum capacitor has an insulating resin frame, a pair of substantially flat metal foil terminals bonded to both sides of the frame, at least one of the frame sides having a slit therethrough and open to the outside of the metal foil terminal on the one frame side, the metal foil terminal on the one frame side being a metal selected from the group consisting of copper and nickel. A tantalum capacitor element having a pair of terminals is enclosed in the frame, at least one of the element terminals being a lead wire made of tantalum, the lead wire extending through the slit and outside the metal foil terminal on the one side of the frame and being bent at the outside surface of the metal foil terminal with the bent portion of the lead wire outside the metal foil terminal extending along the surface of the metal foil terminal and being welded to the metal foil terminal surface for being fixed thereto, the other element terminal being electrically connected to the other metal foil terminal. An insulating resin is potted in the space inside the frame and around the capacitor element.

3 Claims, 25 Drawing Figures

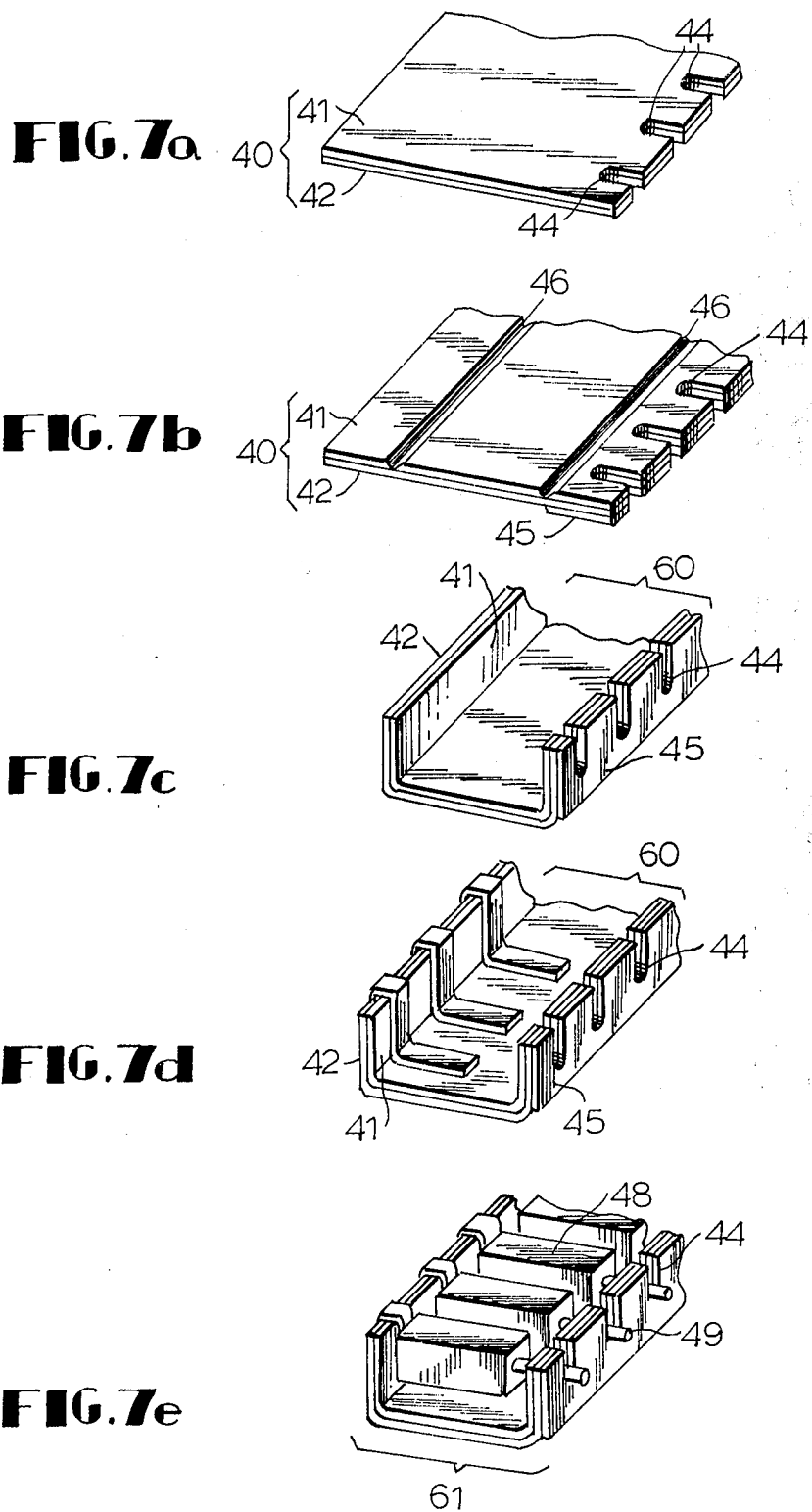

CHIP TYPE TANTALUM CAPACITOR

This invention relates to a chip type electronic component particularly to tantalum chip capacitor, which has terminal electordes of metal foil bonded rigidly to a resin package.

Recently, chip type electronic components have been widely employed in electronic circuits because of demands for miniaturization of electronic apparatus. The terminal construction a chip resistor a chip ceramic capacitor characterized by glazed silver electrode terminals formed the ends of a ceramic substrate or a dielectric substrate gives high volume production efficiency and good size tolerance to the chip component. However, a chip type electronic element having a lead wire terminal such as a tantalum solid electrolytic capacitor element is not easily formed into chip component with such good volume efficiency and good size tolerance as compared with a ceramic chip capacitor.

Better volume production efficiency of a tantalum chip capacitor is obtained by packaging the element with thinner covering or coating. The thinner outside coating of the element is conventionally obtained by employing a metal case or a sleeve. However, such packaging means does not give good size tolerance at lower cost. Further, a transfer molding method is known to give a good size tolerance. However, it does not permit good volume production efficiency. It is a desirable feature for components made by transfer mold method that a pair of metal plate terminals as thin and wide as possible are bonded to the ends of the package. Such terminals are not strongly bonded to the ends of package after transfer molding because terminals are conventionally bent without injuring the inner element.

An object of the present invention is to provide a chip component which can be made by a high volume production efficiency at lower cost.

Another object of the present invention is to provide a chip component having a mechanically strongly bonded metal foil terminal on both ends of the resin package.

Yet another object of the present invention is to provide a chip component having a wide insulating area on the underside facing the circuit board.

Electronic components to which the present invention is applicable are electronic elements such as capacitors, resistors, diodes and other electronic elements and including a tantalum solid electrolytic capacitor These and other objects and features of the invention can be more clearly understood by reference to the attached drawings which illustrate preferred embodiments of the present invention, wherein:

FIGS. 1a to 4b show perspective views and cross-sectional views respectively of chip type electronic components according to the present invention; and FIGS. 5a to 5f, 6a and 6b and 7a to 7i schematically show processes of making a chip component according to the present invention.

Referring now to FIGS. 1a and 1b, 2a and 2b and 3a and 3b, a pair 31 and 32 of metal foils 3 serving as a pair of terminals for a chip component are bonded to both ends of resin frame 21 which encloses an electronic element 1. Construction of the package according to the present invention comprises forming insulating resin means 2 by forming a resin frame 21 and potted resin 22 by distinct steps. The pair of metal foils 3 serving as terminals of the chip component are bonded regidly to both ends of resin frame 22 by an adhesive agent. An electronic element 1 is enclosed in the resin frame.

Element terminal lead wires (the first type element terminal) 5a and 5b are inserted through a slit 4 formed in the metal foil 3 and resin frame 21 and electrically connected to metal foil 3. The metal foil 3 consists of copper, nickel, iron or an alloy of these metals. Excellent solderable metal such as tin, silver or solder is preferably coated on the metal layer. The metal foil preferably consists of copper to which the element lead wire is connected by solder, or electrically conductive paste such as silver conductive paste. The metal foil further preferably consists of a metal such as nickel, iron or an alloy of these metals to which a terminal wire of an element such as a tantalum lead wire of a tantalum capacitor element is connected by welding. In the case of welding, nickel plated copper can also be used as a terminal foil.

Figure 1B:
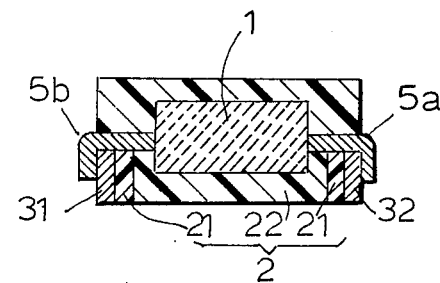
Figure 2A:
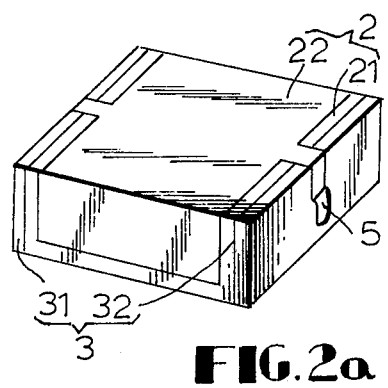
Figure 2B:
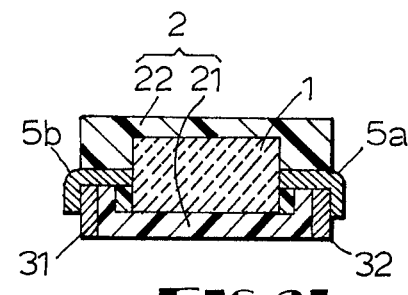
Figure 3A:
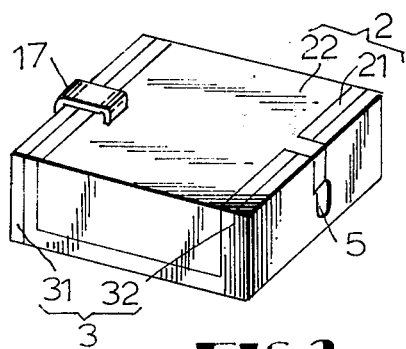
Figure 3B:
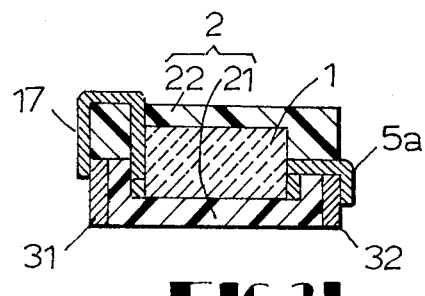

The construction of resin enclosure 2 in FIGS. 2a and 2b is different from that of FIGS. 1a and 1b. In FIGS. 1a and 1b, the resin frame in which the electronic element is to be enclosed has no bottom. However, in FIGS. 2a and 2b, the resin frame in which the electronic element 1 is to be enclosed is a U-shaped member having a bottom.

The resin composition of the frame resin 21 may be the same as or different from that of the potted resin 22. For example, a light emitting diode chip component according to the present invention employs a non-transparent resin as the frame resin and transparent resin as the potted resin, respectivley.

Another electrical connection between the metal layer and electronic element will be described below for an electronic element having at least one element terminal which is formed on the surface portion of the element (second type of element terminal) by means of coated silver or solder metal instead of the lead wire terminal described above. In such a case as shwon in FIGS. 3a and 3b and FIGS. 4a and 4b, the element terminal is electrically connected by employing additional lead ribbons or wires 17 in FIGS. 3a and 3b and 6a and 6b in FIGS. 4a and 4b extending over the edge of the resin frame or through slits in the resin frame and secured to metal foils 31 and 32, by means of adhesive conductive agent such as solder or conductive paste.

Processes of making a chip component according to the present invention are shown in the parts of FIGS. 5a to 7i. Although the present invention will be described in connection with a tantalum solid electrolytic capacitor chip, the present invention is not limited to a tantalum capacitor and is applicable to other electronic components in general.

A method for making a chip type electronic component will be described below in connection with a chip type tantalum solid electrolytic capacitor.

Figure 4A:
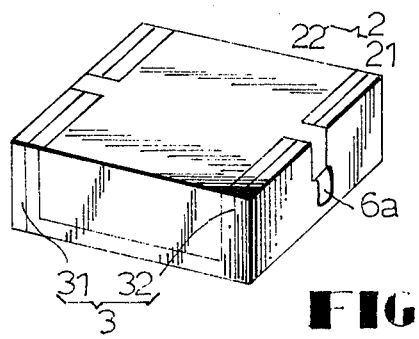
Figure 4B:
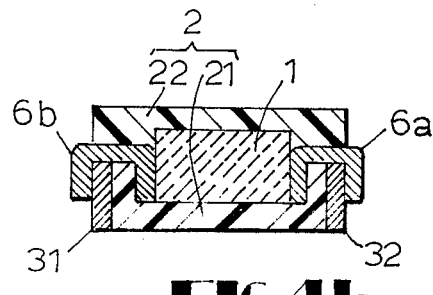
Figure 5A:
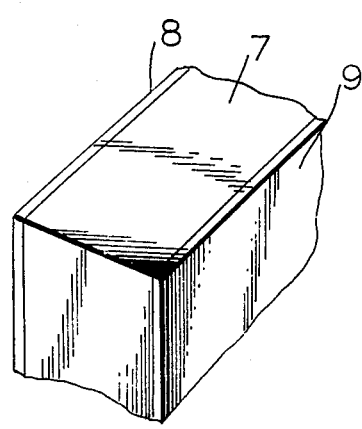
Figure 5B:
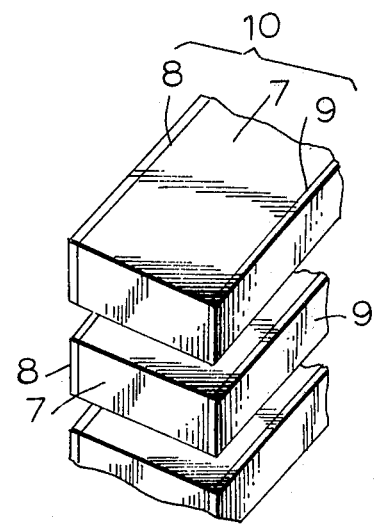
Figure 5C:
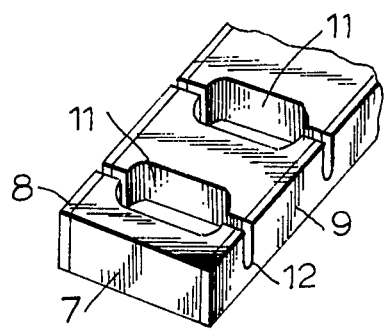
Figure 5D:
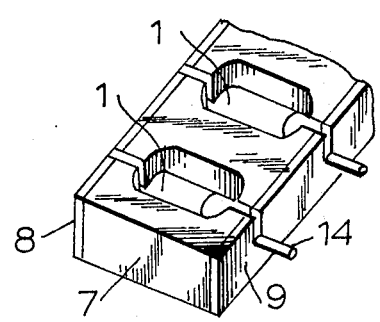

In FIG. 5(a), an insulating resin plate 7 is provided having a copper foil 8 about 35 micron thick bonded by an adhesive agent to one side and having a nickel foil 9 30 to 100 microns thick boned to the other side. The thickness of the insulating resin plate corresponds to the length of the chip component to be produced. In FIG. 5(b), the metal foil carrying resin plate is sliced into slabs 10 1.3 mm thick. In FIG. 5(c), spaces in the form of a hole 11 for receiving electronic elements to be enclosed are provided in the resin 7 and slits 12 formed from holes through the resin to the outside of the metal foil. The width of the slit 12 is preferably slightly greater than the diameter of the element lead wire, and the depth of the slit 12 is preferably about half the thickness of the slab. In next step shown in FIG. 5(d), tantalum solid electrolytic capacitor elements 1 are inserted in the holes 11. Each of the cathodes of the capacitor elements 1 is electrically connected to the outside copper foil 8 by bending the metal wire lead down against the foil and securing it with an adhesive agent such as silver paste or solder in the manner shown in FIG. 1b, or using a ribbon type element terminal as shown in FIG. 4b and securing it with a similar adhesive agent. The tantalum capacitor element is made in a manner well known in the as described below.

A tantalum sintered anode of 0.7 mm diameter and 1.3 mm length having a 0.2 mm tantalum terminal lead wire at the end is anodically oxidized. By the anodic oxidation, a dielectric tantalum oxide film is formed on the surface of the tantalum metal. Layers of manganese dioxide, colloidal graphite and silver as a cathode are formed on the dielectric film in order. The silver paste layer corresponds to the second type element terminal and the tantalum lead wire to the first type element terminal as previously described.

Figure 5E:
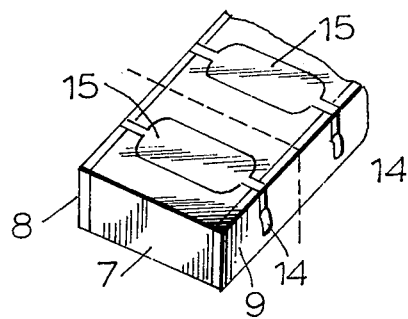
Figure 5F:
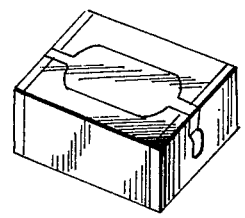

In FIG. 5(e), the hole 11 in which tantalum capacitor element located is filled with liquidous resin 15 such as epoxy resin containing hardener to the top surface of the resin frame 7. Before potting the resin, the outside of the slits 12 and underside of the hole 11 are sealed with adhesive tape, grease or other sealing material in order to prevent leakage of the resin. After curing of the epoxy resin, stains on the surface of the slab are removed if necessary. The tantalum wire 14 is electrically connected to nickel foil 9 by welding. After welding, the structure is cut so as to be divided into individual chip components at the position midway between adjacent slits, as shown by the broken line in FIG. 5(e). FIG. 5(f) shows the thus produced chip type tantalum capacitor.

Figure 6A:
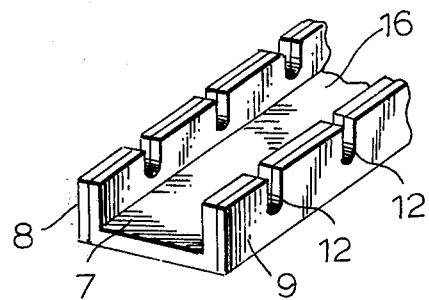
Figure 6B:
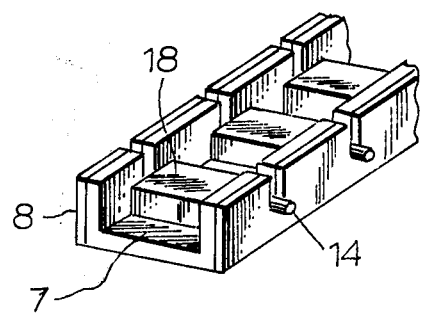

In FIG. 6(a), a U-shape resin frame member 16 for a chip type component as shown in FIG. 2 or 3 according to the present invention is illustrated. The container comprises a U-shaped resin member 7 having slits through at least one side of the member. Copper foil 8 is provided on the ouside of one side and nickel foil 9 on the outside of the other side. In FIG. 6(b), a plurality of tantalum solid electrolytic capacitor elements 18 are inserted in the member 16. After insertion of the elements, chip components are formed as previously described in connection with FIGS. 5e and 5f.

Another method for making a chip component according to the present invention is described below. Although tantalum solid electrolytic capacitor elements are employed as elements to be enclosed, the present invention is not limited to tantalum chip capacitors but is applicable to other electronic components in general.

In this example, a rather thin glass-epoxy resin laminate on one side of which metal foil is bonded is used as a container material in place of the material shown in FIG. 5(a). The copper coated resin laminate is commercially available as a material for flexible printed circuit boards and is satisfactory.

In FIG. 7(a), a copper coated sheet having a base of insulating resin laminate 41 such as glass-epoxy resin laminate and a copper foil 42 which is 35 microns thick bonded to one side of the laminate is cut into a rectangular sheet 40 which is 6 mm wide and conveniently long. Slits 44 are formed at a regular interval along one edge portion of the sheet 40. Each slit 44 is 0.35 mm wide and 0.7 mm long. The interval between the slits is 2 mm. In FIG. 7(b), a nickel metal layer 45 about 50 microns and 1.5 mm wide is plated on the copper foil 42 on the portion of the edge in which the slits are located.

Two parallel straight line grooves 46 are provided on surface of the base resin 41 spaced inwardly 1.5 mm from the edges of the sheet 40 and as deep as possible in the base resin by using a scratching tool. The grooves are necessary to avoid breaking of the base resin due to its brittleness in the following bending step. The grooves 56, therefore, should not be so deep as to reach the copper foil 42. In FIG. 7(c), the sheet 40 is bent substantially 90° along the grooves in a manner such that the sides, after bending, face each other and the sheet is formed into a U-shaped frame 60 for an electronic element to be enclosed therein. The thus produced frame 60 is about 3 mm wide at the bottom and the sides are 1.5 mm high, and the frame is sufficiently strong to keep the U-shape due to the mechanical strength of the copper foil. In FIG. 7(d), one end of a copper ribbon serving electric connection means is connected to copper foil 42 by a process such as soldering, and the ribbon is bent over the side and the other end is placed on the bottom of the U-shaped frame 60. In FIG. 7(e), a plurality of tantalum solid capacitor elements 48 are inserted into the container 60, and the cathodes of the respective tantalum capacitor elements are electrically connected corresponding copper ribbson 47 by an electric conductive adhesive agent such as solder or silver paste. Electric conductive adhesive agent is applied to either or both of the copper ribbon and the cathode surface of the capacitor element before element insertion. The tantalum solid capacitor element employed in this method are rectangular blocks and have a size of $1.0 \times 1.2 \times 1.9$ mm$^3$ and have a tantalum lead wire at one end.

Figure 7F:
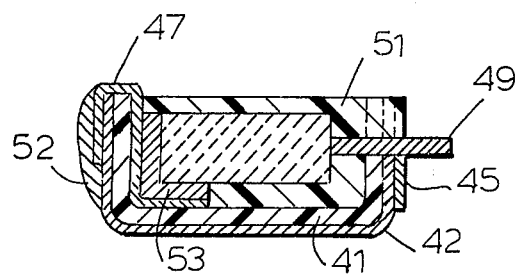
Figure 7G:
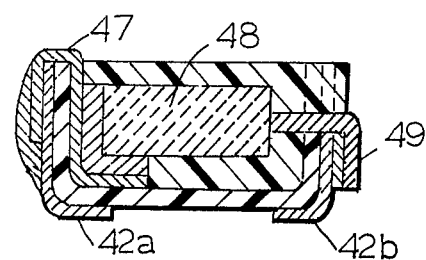

In FIG. 7(f), liquidous resin such as epoxy resin containing hardener 41 is potted in the frame. Before epoxy resin potting, slits and ends of the container are required to be sealed for the purpose of avoiding resin leakage by means of any suitable sealant such as silicone resin or UV-resin (resin which is solidified by ultra-violet rays) having a rather high viscosity. The potted resin is cured. After curing, sealant and stains are removed if necessary. In FIG. 7(g), a strip of copper foil 42 which is 2 mm wide is removed from the center of the underside of the frame by means of grinding or chemical etching. Consequently, the remaining copper foils become the two terminals of the chip component. Tantalum lead wire 49 is bent and attached to nickel layer 45 by means of a resistance welder having parallel gap electrodes.

Figure 7H:
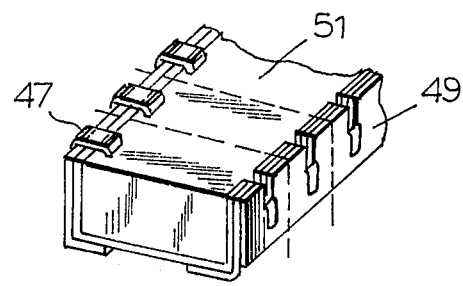
Figure 7I:
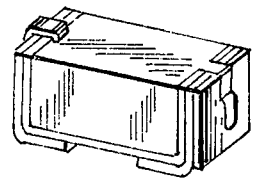

The structure is then cut so as to be divided into individual chip components at the center position between adjacent slits as shown by the broken line in FIG. 7(h). FIG 7(i) illustrates the thus produced chip component.

In the method according to FIGS. 7a-7i, the copper foil on the underside of the container is removed after the welding step as shown in FIG. 7(g). However, the removal of copper foil may be carried out after the rectangular sheet providing step.

In the above method, furthermore, a tantalum capacitor element is employed as a component element and consequently a nickel layer is required on the copper foil for the purpose of welding tantalum wire to the component terminal. However, a nickel plated layer is not necessary in the case where the component element has solderable lead wires.

A solder coating on the copper foil and the nickel layer is further preferred for superior solderability to a circuit board.

In place of an electrical connection between the tantalum cathode layer and component terminal 42a by a copper ribbon 47, the connection may be carried out by soldering through a metal plated hole cut at a position on the component terminal which end opposite to the tantalum capacitor element-lead wire end.

A method in which resin is potted and cured without leaking out of the slits and without the need to use a sealant for the slits will be described below. For the frame shown in FIG. 6(b) and FIG. 7(e), both ends of the center of the U-shape are preliminarily banked with sealant such as silicone sealant before resin potting. For the frame shown in FIG. 5(d), the under-side of the holes are sealed with adhesive tape before resin potting. Immediately after the frame is potted with resin such as liquidous epoxy resin containing hardener, it is turned upside down before the resin leaks from the slits. With the opening of the frame facing downwards, the resin is cured.

With the opening of the frame facing downwards, the resin of ordinary viscosity does not leak out from the slit if the width of the frame opening is less than about 10 mm.

In accordance with the previous description, the terminal electrodes of the chip component according to the present invention are very resistant to peeling off. This is firstly because the thin metal foil of the terminal is resistant to the peeling force caused by, for example, the difference of thermal expansion coefficient of the metal and the frame resin. It is secondly because the metal foil can be strongly bonded to the resin frame under more favorable conditions such as high pressure or high temperature by using adhesive agent without any fear of injury to the element of bonding before element enclosure.

What is claimed is:

1. A chip type tantalum capacitor comprising:
   an insulating resin frame;
   a pair of substantially flat metal foil terminals bonded to both sides of said frame, at least one of said frame sides having a slit therethrough an open to the outside of said metal foil terminal on said one frame side, said metal foil terminal on said one frame side being a metal selected from the group consisting of copper and nickel;
   a tantalum capacitor element having a pair of terminals and enclosed in said frame, at least one of said element terminals being a lead wire made of tantalum, said lead wire extending through said slit and outside said metal foil terminal on said one side of said frame and being bent at the outside surface of said metal foil terminal with the bent portion of the lead wire outside said metal foil terminal extending along the surface of said metal foil terminal and being welded to said metal foil terminal surface for being fixed thereto, the other element terminal being electrically connected to the other metal foil terminal; and
   an insulating resin potted in the space inside said frame and around said capacitor element.

2. A chip type tantalum capacitor according to claim 1, wherein said metal foil terminal is nickel plated copper.

3. A chip type tantalum capacitor according to claim 1, wherein said insulating resin frame is rectangular, and said metal foil terminal is bonded thereto by an adhesive.

* * * * *